(12) United States Patent
Nonoguchi et al.

(10) Patent No.: US 10,355,190 B2
(45) Date of Patent: Jul. 16, 2019

(54) NANOMATERIAL DOPANT COMPOSITION COMPOSITE, DOPANT COMPOSITION, AND METHOD FOR MANUFACTURING NANOMATERIAL DOPANT COMPOSITION COMPOSITE

(71) Applicants: NATIONAL UNIVERSITY CORPORATION NARA INSTITUTE OF SCIENCE AND TECHNOLOGY, Nara (JP); SEKISUI CHEMICAL CO., LTD., Osaka (JP)

(72) Inventors: Yoshiyuki Nonoguchi, Nara (JP); Tsuyoshi Kawai, Nara (JP); Motohiro Nakano, Nara (JP)

(73) Assignees: NATIONAL UNIVERSITY CORPORATION NARA INSTITUTE OF SCIENCE AND TECHNOLOGY, Nara (JP); SEKISUI CHEMICAL CO., LTD., Osaka (JP)

( * ) Notice: Subject to any disclaimer, the term of this patent is extended or adjusted under 35 U.S.C. 154(b) by 295 days.

(21) Appl. No.: 15/313,790

(22) PCT Filed: Jun. 19, 2015

(86) PCT No.: PCT/JP2015/067697
§ 371 (c)(1),
(2) Date: Nov. 23, 2016

(87) PCT Pub. No.: WO2015/198980
PCT Pub. Date: Dec. 30, 2015

(65) Prior Publication Data
US 2017/0197836 A1    Jul. 13, 2017

(51) Int. Cl.
*B82Y 30/00* (2011.01)
*B82Y 40/00* (2011.01)
(Continued)

(52) U.S. Cl.
CPC .............. *H01L 35/28* (2013.01); *B82Y 30/00* (2013.01); *B82Y 40/00* (2013.01); *C01B 32/174* (2017.08);
(Continued)

(58) Field of Classification Search
CPC ......... H01L 35/14; H01L 35/16; H01L 35/22; C01B 32/174; C01B 19/02; C01B 2202/02; C01B 19/24; C01B 19/22; B82Y 40/00
See application file for complete search history.

(56) References Cited

U.S. PATENT DOCUMENTS

| 8,603,836 B2 | 12/2013 | Yoon et al. |
| 2008/0031802 A1 | 2/2008 | Ma et al. |

(Continued)

FOREIGN PATENT DOCUMENTS

| CN | 103818898 | * | 5/2014 |
| JP | H08127534 A | | 5/1996 |

(Continued)

OTHER PUBLICATIONS

Blair et al, "Evaluation of Alkali Metal Binding Selectivities of Caged Aza-Crown Ether Ligands by Microelectrospray Ionization/Quadrupole Ion Trap Mass Spectrometry", J. Am. Soc. Mass Spectrom.,Oct. 2000, vol. 11, issue 10, pp. 884-891.*

(Continued)

*Primary Examiner* — C Melissa Koslow
(74) *Attorney, Agent, or Firm* — Osha Liang LLP (57) ABSTRACT

The present invention provides a method for manufacturing a dopant composition-nanomaterial composite, which method makes it possible to simply and efficiently change a Seebeck coefficient value of a nanomaterial. This manufacture method of the present invention includes the step of putting a dopant composition in contact with a nanomaterial (Continued)

in a solvent, the dopant composition containing an anion, a cation, and a scavenger.

11 Claims, 3 Drawing Sheets

(51) Int. Cl.

| | | |
|---|---|---|
| H01L 29/06 | (2006.01) | |
| H01L 35/22 | (2006.01) | |
| H01L 35/28 | (2006.01) | |
| H01L 35/34 | (2006.01) | |
| H01L 51/00 | (2006.01) | |
| H01L 51/05 | (2006.01) | |
| H01L 51/42 | (2006.01) | |
| C01B 32/174 | (2017.01) | |
| C01B 32/178 | (2017.01) | |
| C01B 32/194 | (2017.01) | |

(52) U.S. Cl.
CPC .......... *C01B 32/178* (2017.08); *C01B 32/194* (2017.08); *H01L 29/06* (2013.01); *H01L 35/22* (2013.01); *H01L 35/34* (2013.01); *H01L 51/00* (2013.01); *H01L 51/0048* (2013.01); *C01B 2202/02* (2013.01); *C01B 2202/10* (2013.01); *C01B 2202/22* (2013.01); *H01L 51/0558* (2013.01); *H01L 51/42* (2013.01); *Y10S 977/744* (2013.01); *Y10S 977/751* (2013.01); *Y10S 977/846* (2013.01); *Y10S 977/948* (2013.01)

(56) References Cited

U.S. PATENT DOCUMENTS

| | | |
|---|---|---|
| 2009/0022650 A1 | 1/2009 | Choi et al. |
| 2009/0044848 A1 | 2/2009 | Lashmore et al. |
| 2009/0221130 A1 | 9/2009 | Asano |
| 2010/0140561 A1 | 6/2010 | Choi et al. |
| 2010/0166624 A1 | 7/2010 | Raston et al. |
| 2011/0215416 A1 | 9/2011 | Choi et al. |
| 2012/0003564 A1 | 1/2012 | Adachi et al. |
| 2014/0230871 A1 | 8/2014 | Nishio et al. |

FOREIGN PATENT DOCUMENTS

| | | |
|---|---|---|
| JP | 2008517863 A | 5/2008 |
| JP | 2009023906 A | 2/2009 |
| JP | 2009292714 A | 12/2009 |
| JP | 201138082 A | 2/2011 |
| JP | 2013082786 A | 5/2013 |
| JP | 2014005233 A | 1/2014 |
| WO | 2008023399 A1 | 2/2008 |
| WO | 2009023776 A1 | 2/2009 |
| WO | 2013065631 A1 | 5/2013 |
| WO | 2014133029 A1 | 9/2014 |

OTHER PUBLICATIONS

Translation for CN 102818898, May 28, 2014.*
Office Action issued in Japanese Application No. 2016-529537 dated May 9, 2017 (11 pages).
EPO Communication (Office Action) with an Extended European Search Report dated Jun. 2, 2017, issued by the European Patent Office in corresponding European Patent Application No. EP-15811494.2) (9 pages).
Porchelvi, K.N., et al., "In Situ Synthesis of Copper Phthalocyanine Modified Multiwalled Carbon Tube and its Electrocatalytic Application towards the Oxidation of Nitrite"; Advanced Materials Research, vol. 938, Jun. 6, 2014 (Jun. 6, 2014); XP055373891; ISSN: 1022-6680, DOI: 10.4028/www.scientific.net/AMR.938.40; pp. 40-45.
Ballesteros-Garrido, Rafael, et al., "Tunability by alkali metal cations of photoinduced charge separation in azacrown functionalized graphene"; Chemical Communications, RSC Publishing, vol. 49, No. 31, Feb. 18, 2013 (Feb. 18, 2013); XP055373874; ISSN: 1359-7345, DOI: 10.1039/c3cc39145k; pp. 3236-3238.
Shulan, Ma, et al., "Intercalation of Macrocyclic Crown Ether into Well-Crystallized LDH: Formation of Staging Structure and Secondary Host—Guest Reaction"; Chemistry of Materials, vol. 21, No. 15, 11 A Aug. 2009 (Aug. 11, 2009); XP055373886, ISSN: 0897-4756, DOI: 10.1021/cm9007393; pp. 3602-3610.
International Search Report issued in corresponding application No. PCT/JP2015/067697 dated Sep. 15, 2015 (9 pages).
International Preliminary Report on Patentability issued in corresponding application No. PCT/JP2015/067697 dated Dec. 27, 2016 (7 pages).
K. Suemori et al., "Flexible and lightweight thermoelectric generators composed of carbon nanotube-polystyrene composites printed on film substrate" Applied Physics Letters, 2013, 103, 153902 (5 pages).
R.Czerw et al., "Identification of Electron Donor States in N-Doped Carbon Nanotubes" Nano Letters, 2001, vol. 1, No. 9, pp. 457-460 (4 pages).
Lee, R. S. et al., "Conductivity enhancement in single-walled carbon nanotube bundles doped with K and Br" Nature, vol. 388, Jul. 17, 1997, pp. 255-257 (3 pages).
Shim, Moonsub et al., "Polymer Functionalization for Air-Stable n-Type Carbon Nanotube Field-Effect Transistors" J. Am. Chem. Soc. 2001, 123, 11512-11513 (2 pages).
Ryu, Yeontack et al., "High electrical conductivity and n-type thermopower from double-/single-wall carbon nanotubes by manipulating charge interactions between nanotubes and organic/inorganic nanomaterials" Carbon, 2011, 49, pp. 4745-4751 (7 pages).
Kim, Soo Min et al., " Reduction-Controlled Viologen in Bisolvent as an Environmentally Stable n-Type Dopant for Carbon Nanotubes" J. Am. Chem. Soc. 2009, 131, pp. 327-331 (5 pages).
Nonoguchi, Yoshiyuki et al., "Systematic Conversion of Single Walled Carbon Nanotubes into n-type Thermoelectric Materials by Molecular Dopants" Scientific Reports, 2013, pp. 1-7 (7 pages).
S.M. Blair et al.: "Evaluation of Alkali Metal Binding Selectivities of Caged Aza-Crown Ether Ligands by Microelectrospray Ionization/Quadrupole Ion Trap Mass Spectrometry," Journal of the American Society for Mass Spectrometry, Oct. 1, 2000, vol. 11, No. 10, pp. 884-891 (8 pages).
A. Khazaei et al.: "Functionalization of oxidized single-walled carbon nanotubes with 4-benzo-9-crown-3 ether," J. Chem. Sci., Sep. 30, 2012, vol. 124, No. 5, pp. 1127-1135 (9 pages).
First Office Action issued in Chinese Patent Application No. 201580022883.9; dated Jun. 29, 2018 (15 pages).
Office Action issued in European Patent Application No. 15811494.2; dated Jul. 6, 2018 (7 pages).

* cited by examiner

NANOMATERIAL DOPANT COMPOSITION COMPOSITE, DOPANT COMPOSITION, AND METHOD FOR MANUFACTURING NANOMATERIAL DOPANT COMPOSITION COMPOSITE

TECHNICAL FIELD

The present invention relates to a method for manufacturing a dopant composition-nanomaterial composite, the dopant composition-nanomaterial composite and a dopant composition.

BACKGROUND ART

In recent years, in the fields of thermoelectric conversion elements, field-effect transistors, sensors, integrated circuits, rectifying elements, photovoltaic cells, catalysts, electroluminescence, and the like, attention has been drawn to use of nanomaterials for making a flexible element or a small and light-weight element.

Figure 1:
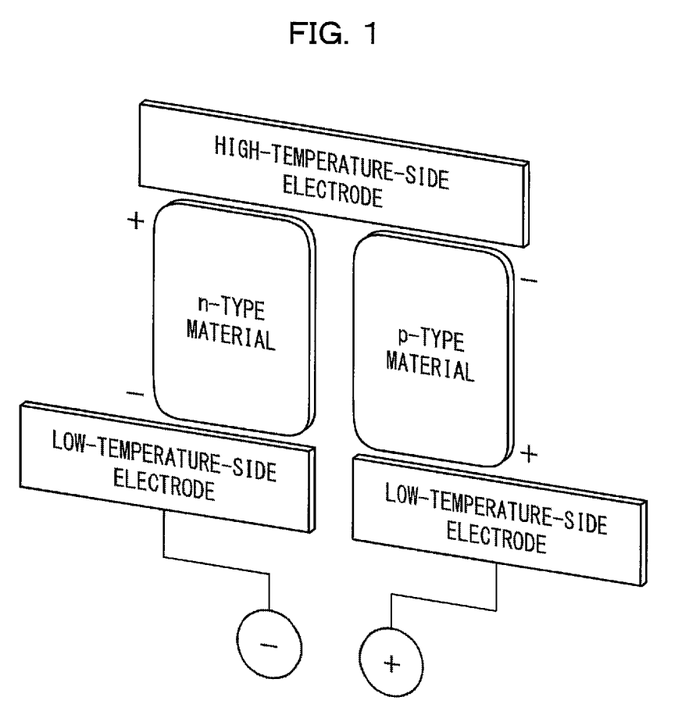
FIG. 1 is a view schematically illustrating an example of a bipolar thermoelectric conversion element that includes an n-type material and a p-type material.

In the above fields, it is typically preferable to use a bipolar element which includes both a material exhibiting p-type conductivity and a material exhibiting n-type conductivity. For example, thermoelectric conversion elements are elements used for thermoelectric generation. In the thermoelectric generation, power is generated by utilizing potential difference which occurs in a substance due to temperature difference. In a case where a thermoelectric conversion element including only one of a thermoelectric conversion material exhibiting p-type conductivity and a thermoelectric conversion material exhibiting n-type conductivity is used, power generation efficiency is poor. This is because heat is lost through a high-temperature-side terminal. FIG. 1 is a view schematically illustrating a bipolar thermoelectric conversion element which employs both a thermoelectric conversion material having n-type conductivity (n-type material) and a thermoelectric conversion material having p-type conductivity (p-type material). In a case where such a bipolar thermoelectric conversion element is used, power can be efficiently generated by connecting the thermoelectric conversion material having n-type conductivity and the thermoelectric conversion material having p-type conductivity in series.

Patent Literature 1 and Non-Patent Literature 1 each disclose a thermoelectric conversion material containing a carbon nanotube. The carbon nanotube utilized in technologies disclosed in Patent Literature 1 and Non-Patent Literature 1 is mainly a nanomaterial having p-type conductivity. As in the cases disclosed in Patent Literature 1 and Non-Patent Literature 1, nanomaterials often exhibit p-type conductivity. Accordingly, there is a demand for a technique for converting a nanomaterial exhibiting p-type conductivity into a nanomaterial exhibiting n-type conductivity. Note that a polarity exhibited by a nanomaterial (whether a nanomaterial exhibits p-type conductivity or n-type conductivity) can be determined depending on whether a Seebeck coefficient is positive or negative. In other words, the technique for converting a polarity of a nanomaterial is a technique for changing a Seebeck coefficient.

For example, studies are made on conversion of a carbon nanotube exhibiting p-type conductivity into a carbon nanotube exhibiting n-type conductivity. So far, it has been reported that nitrogen atom exchange, alkali metal doping, or the like allows for conversion of a carbon nanotube having p-type conductivity into a carbon nanotube having n-type conductivity (for example, see Non-Patent Literatures 2 and 3).

Further, Non-Patent Literatures 4 and 5 each disclose that doping of a carbon nanotube with polyethylenimine allows for conversion of a carbon nanotube having p-type conductivity into a carbon nanotube having n-type conductivity. In addition, it has been reported that benzylviologen, ammonium and nicotinamide each can be also used as a dopant for converting a carbon nanotube having p-type conductivity into a carbon nanotube having n-type conductivity (see Non-Patent Literature 6, and Patent Literatures 2 and 3).

Furthermore, the inventors of the present invention have found that: several dopants are each capable of converting a single walled carbon nanotube having p-type conductivity into a single walled carbon nanotube having n-type conductivity; and each of these dopants has a HOMO level in a specific range (see Non-Patent Literature 7).

CITATION LIST

Patent Literatures

Patent Literature 1
Pamphlet of PCT International Publication No. WO 2013/065631 (Publication Date: May 10, 2013)
Patent Literature 2
Specification of U.S. Pat. No. 8,603,836 (Registration Date: Dec. 10, 2013)
Patent Literature 3
Japanese Patent Application Publication, Tokukai, No. 2009-292714 (Publication Date: Dec. 17, 2009)

Non-Patent Literatures

Non-Patent Literature 1
K. Suemori et al., Appl. Phys. Lett., 2013, 103, 153902.
Non-Patent Literature 2
R. Czerw et al, Nano Lett., 2001, VOL. 1, NO. 9, 457-460.
Non-Patent Literature 3
R. S. Lee et al., Nature, 2001, VOL. 388, 255-257.
Non-Patent Literature 4
M. Shim et al., J. Am. Chem. Soc., 2001, 123, 11512-11513.
Non-Patent Literature 5
Y. Ryu et al, Carbon, 2011, 49, 4745-4751.
Non-Patent Literature 6
S. M. Kim et al., J. Am. Chem. Soc., 2009, 131, 327-331.
Non-Patent Literature 7
Y. Nonoguchi et al., Sci. Rep., 2013, 3, 3344.

SUMMARY OF INVENTION

Technical Problem

However, in the background art described above, a method for changing a Seebeck coefficient of a nanomaterial has not yet been systemized. In other words, though several dopants (n-type dopants) for conversion of a nanomaterial having p-type conductivity into a nanomaterial having n-type conductivity have been reported, a substance similar in property or structure to the known dopants cannot always serve as an n-type dopant in the same way as the known dopants. Accordingly, it is inevitable to employ a trial-and-error method for development of a novel dopant. The trial-and-error method requires considerable amounts of cost, time and labor before attainment of a novel dopant, and is highly inefficient.

Furthermore, in a conventional method for manufacturing a carbon nanotube having n-type conductivity, for example, heating (e.g., Patent Literature 3) and/or the like is required. Accordingly, the conventional method is not simple in operation. On this account, it is not easy to mass-produce carbon nanotubes having n-type conductivity. Meanwhile, in a technique disclosed in Non-Patent Literature 7, it is necessary to use a dopant whose cost is higher than a certain level. Additionally, the technique disclosed in Non-Patent Literature 7 requires use of an organic solvent, and further is limited to application to single walled carbon nanotubes. In view of the above, there is a demand for a more simple and efficient method for manufacturing a nanomaterial having n-type conductivity.

The present invention is attained in view of the above problems. An object of the present invention is to provide a method for simply and efficiently changing a Seebeck coefficient value of a nanomaterial.

Solution to Problem

As a result of diligent studies for solving the above problem, the inventors of the present invention have uniquely found the followings: (i) anions can be widely used as dopants; and (ii) use of a scavenger allows capture of a cation which is a counter ion of an anion, so that efficient doping with the anion becomes possible. The inventors of the present invention have then revealed that use of the anion as a dopant makes it possible to simply and efficiently change a Seebeck coefficient of a nanomaterial.

In other words, a method in accordance with the present invention for manufacturing a dopant composition-nanomaterial composite includes the step of putting a dopant composition in contact with a nanomaterial in a solvent, the dopant composition being a composition for changing a Seebeck coefficient of a nanomaterial, and containing an anion, a cation, and a scavenger for capturing the cation.

Further, a dopant composition in accordance with the present invention for changing a Seebeck coefficient of a nanomaterial is a dopant composition containing an anion, a cation, and a scavenger for capturing the cation.

Advantageous Effects of Invention

A method in accordance with the present invention for manufacturing a dopant composition-nanomaterial composite includes the step of putting a dopant composition in contact with a nanomaterial in a solvent, the dopant composition being a composition for changing a Seebeck coefficient of a nanomaterial, and containing an anion, a cation, and a scavenger for capturing the cation.

This makes it possible to simply and efficiently change a Seebeck coefficient value of a nanomaterial.

DESCRIPTION OF EMBODIMENTS

The following discusses in detail an example of embodiments of the present invention. The present invention is, however, by no means limited to this example. Note that the numerical range "A to B" herein means "not less than A and not more than B" unless otherwise noted.

[Method for Manufacturing Dopant Composition-Nanomaterial Composite]

A method in accordance with the present invention for manufacturing a dopant composition-nanomaterial composite (hereinafter, also referred to as "a manufacture method of the present invention") includes the step of putting a dopant composition in contact with a nanomaterial in a solvent, the dopant composition being a composition for changing a Seebeck coefficient of a nanomaterial.

<Nanomaterial>

The term "nanomaterial" herein means a substance having a nanoscale size (e.g., not more than 100 nm) at least in one direction. The nanomaterial is a substance used as, for example, an electronic material.

The nanomaterial can be a low-dimensional nanomaterial. The term "low dimensional" herein means having the number of dimensions lower than three. That is, the term "low dimensional" herein means "zero dimensional", "one dimensional", or "two dimensional". Further, the term "low-dimensional nanomaterial" herein means a nanomaterial whose steric structure can be substantially defined in "low dimension".

Zero-dimensional nanomaterials can be, for example, nanoparticles (quantum dots). One-dimensional nanomaterials can be, for example, nanotubes, nanowires, or nanorods. Two-dimensional nanomaterials can be, for example, nanosheets.

The nanomaterial can be made of or contain at least one selected from the group consisting of carbon, semiconductor, semimetal and metal. Examples of nanomaterials made of carbon encompass carbon nanotubes and graphenes (i.e., nanosheets made of carbon). In the present specification, the carbon nanotubes may be referred to as "CNTs".

Examples of the semiconductor encompass iron silicide, sodium cobaltate, and antimony telluride. Examples of the semimetal encompass tellurium, boron, germanium, arsenic, antimony, selenium, and graphite. Examples of the metal encompass gold, silver, copper, platinum, and nickel.

The nanotubes and the nanosheets can have a single-layer structure or a multi-layer (two-layer, three-layer, four-layer or more-than-four-layer) structure. The nanotubes can be made of carbon. In the present specification, single-layer carbon nanotubes may be referred to as SWNTs (single-wall carbon nanotubes), while multi-layer carbon nanotubes may be referred to as MWNTs (multi-wall carbon nanotubes).

<Dopant Composition>

The term "dopant composition" herein means a composition containing a dopant. Further, the term "dopant" herein means a substance which changes a Seebeck coefficient of a material to be doped with the dopant. In the manufacture method of the present invention, the material to be doped with the dopant is the above-described nanomaterial.

The Seebeck coefficient means a ratio of an open-circuit voltage to a difference between a temperature at a high-temperature joint and a temperature at a low-temperature joint in a circuit exhibiting a Seebeck effect ("McGraw-Hill Dictionary of Scientific and Technical Terms Third-Edition"). The Seebeck coefficient can be an indicator in determining a polarity of an electronic material such as a nanomaterial. More specifically, for example, a nanomaterial having a positive Seebeck coefficient value has p-type conductivity. On the other hand, a nanomaterial having a negative Seebeck coefficient value has n-type conductivity. The Seebeck coefficient can be measured by use of, for example, a Seebeck effect measurement device (manufactured by MMR Technologies, Inc.) employed in Examples which will be described later.

The wording "changing a Seebeck coefficient" herein means decreasing a Seebeck coefficient value or changing a Seebeck coefficient from a positive value to a negative value. Accordingly, the wording "dopant (or dopant composition) for changing a Seebeck coefficient of a nanomaterial" means a dopant (or a dopant composition) capable of making a Seebeck coefficient value of a nanomaterial doped with the dopant (or the dopant composition) lower than a Seebeck coefficient value prior to such doping, or a dopant (or a dopant composition) capable of changing a Seebeck coefficient value of a nanomaterial doped with the dopant (or the dopant composition) to a negative value from a positive value.

In the present specification, particularly, the dopant capable of changing a Seebeck coefficient value of a nanomaterial from a positive value to a negative value may be referred to as an n-type dopant. When the dopant is an n-type dopant, it is possible to cause a dopant composition-nanomaterial composite obtained by the manufacture method of the present invention to have n-type conductivity. Further, when the dopant composition-nanomaterial composite has n-type conductivity, the dopant composition-nanomaterial composite can be used as an n-type material in a bipolar element. Accordingly, it is preferable that the dopant composition-nanomaterial composite has n-type conductivity.

The manufacture method of the present invention is characterized in that the dopant composition contains an anion as the dopant. Anions change nanomaterial carriers from holes to electrons. Accordingly, the above dopant composition changes a Seebeck coefficient of a nanomaterial. Examples of the anion encompass hydroxy ions ($OH^-$), alkoxy ions ($CH_3O^-$, $CH_3CH_2O^-$, i-$PrO^-$, t-$BuO^-$, etc.), $SH^-$, $CH_3S^-$, $C_2H_5S^-$, etc., cyanide ions ($CN^-$), $I^-$, $Br^-$, $Cl^-$, carboxy ions ($CH_3COO^-$ etc.), $NO_3^-$, $BF_4^{31}$, $ClO_4^-$, triflate ($TfO^-$), and tosylate ($Tos^-$). In particular, the anion is preferably at least one selected from the group consisting of $OH^-$, $CH_3O^-$, $CH_3CH_3O^-$, i-$PrO^-$, t-$BuO^-$, $SH^-$, $CH_3S^-$, $C_2H_5S^-$, $CN^-$, $Br^-$, $Cl^-$ and $CH_3COO^-$, more preferably at least either $OH^-$ or $CH_3O^-$. The above anions can efficiently change a Seebeck coefficient of a nanomaterial.

One possible reason why an anion acts as the dopant is that the anion has an unshared electron pair. It is inferred that the anion interacts, via such an unshared electron pair, with a nanomaterial to be doped, or the anion induces, via such an unshared electron pair, a chemical reaction with a nanomaterial to be doped. Further, Examples described later suggests the importance of Lewis basicity, intermolecular force and dissociability of the dopant in doping efficiency. The term "Lewis basicity" herein means a property of donating an electron pair. A dopant having a higher Lewis basicity is considered to have a larger effect on a change in Seebeck coefficient. Further, the intermolecular force of the dopant is considered to be relevant to adsorption of the dopant to a nanomaterial. The intermolecular force of the dopant can be a hydrogen bond, a CH-πinteraction, a π-πinteraction, or the like. The dissociability of the dopant will be described later.

It is clear from the above that among the above anions, the anion is preferably an anion which forms a weak hydrogen bond. Examples of such an anion which forms a weak hydrogen bond encompass $OH^-$, $CH_3O^-$, $CH_3CH_2O^-$, i-$PrO^-$, and t-$BuO^-$. Further, the anion is preferably an anion which causes a π-π interaction. An example of such an anion which causes a π-π interaction is $CH_3COO^-$.

In the manufacture method of the present invention, the dopant composition contains an anion, a cation, and a scavenger for capturing the cation. Accordingly, the scavenger captures the cation, so that the anion can be dissociated. This makes it possible to efficiently dope, in a solvent, a nanomaterial with the anion dissociated. Note that the dopant composition can contain a compound which is dissociated in a solvent and consequently produces the anion and the cation.

The cation can be, for example, a metal ion. The metal ion can be typical metal ions, transition metal ions, or the like ions. Examples of the metal ion encompass lithium ions, sodium ions, potassium ions, rubidium ions, cesium ions, francium ions, beryllium ions, magnesium ions, calcium ions, strontium ions, barium ions, radium ions, and scandium ions.

The scavenger can be any substance which is capable of taking in a cation, and is not particularly limited. The scavenger can be, for example, a general ion adsorbent. When the cation is a metal ion, the ion adsorbent can be an organic ligand or the like. The term "organic ligand" herein means a compound which forms a coordination bond with a metal ion. In other words, the organic ligand is a compound having a coordination unit for a metal ion. The organic ligand can contain, as a coordinating atom, at least one kind selected from the group consisting of an oxygen atom, a nitrogen atom, a sulfur atom, and a phosphorus atom. The organic ligand can be a monodentate organic ligand (i.e., a compound having a single coordination unit) or a multidentate organic ligand (i.e., a compound having two or more coordination units). For more efficient capture of metal ions, the organic ligand is preferably a multidentate organic ligand. Examples of the multidentate ligand encompass cyclodextrin, crown ether, azacrown ether, ethylenediaminetetraacetate, calixarene, porphyrin, phthalocyanine, salen, and derivatives thereof. In particular, ethylenediaminetetraacetate is preferably used as the organic ligand in solution, while crown ether is preferably used as the organic ligand in organic solvent.

The crown ether can be, for example, a crown ether represented by the following General Formula (I):

[Chem. 1]

(I)

wherein n is an integer of not less than 1.

Note that when the crown ether represented by the above General Formula (I) takes in a metal ion from a compound, a complex is formed, and this complex is represented by the following General Formula (II).

[Chem. 2]

(II)

wherein: n is an integer of not less than 1; Z is the above-described metal ion; and X⁻ is the above-described anion. It is clear from General Formula (II) that use of the crown ether allows dissociation of an anion.

Examples of the crown ether include crown ethers represented by the following formulae (a) through (c):

[Chem. 3]

The above formula (a) is 12-crown-4; the above formula (b) is 15-crown-5; and the above formula (c) is 18-crown-6. The crown ether to be used as the scavenger should be selected in accordance with a size of a metal ion to be taken in. For example, when the metal ion is a potassium ion, 18-crown-6 is preferably used; when the metal ion is a sodium ion, 15-crown-5 is preferably used; and when the metal ion is a lithium ion, 12-crown-4 is preferably used. When the crown ether takes in a metal ion from a compound, a complex represented by, for example, any of the following formulae (d) through (f) is formed.

[Chem. 4]

The above formula (d) represents a complex which is formed in a case where 12-crown-4 takes in a lithium ion from lithium hydroxide. The above formula (e) represents a complex which is formed in a case where 15-crown-5 takes in a sodium ion from sodium hydroxide. The above formula (f) represents a complex which is formed in a case where 18-crown-6 takes in a potassium ion from potassium hydroxide.

For more efficient dissociation of anions, preferably, the crown ether is added to a solvent so that the mole ratio of a metal ion and the crown ether will be 1:1.

As described above, in the manufacture method of the present invention, the dissociability of the dopant is important in addition to the Lewis basicity and the intermolecular force of the dopant. The dopant is preferably a dopant that dissociates more anions. Accordingly, in regard to the compound which is dissociated in a solvent and consequently produces the anion and the cation, a dissociation constant of the compound is important. For example, the compound preferably has a dissociation constant pKa of not less than 7, more preferably not less than 14.

The dopant composition of the present invention can contain a substance as appropriate, in addition to the anion, the cation, and the scavenger which are described above. Such a substance is not particularly limited as long as the substance does not inhibit an action of the dopant.

Further, the dopant composition of the present invention can contain more than one kind of dopant.

<Contact Step>

A contact step is the step of forming a composite of a dopant composition and a nanomaterial (a dopant composition-nanomaterial composite) by putting the dopant composition in contact with the nanomaterial in a solvent, the dopant composition being a composition for changing a Seebeck coefficient of the nanomaterial.

The contact step is not particularly limited in method as long as the nanomaterial and the dopant composition can be put in contact with each other in the contact step. For example, the nanomaterial and the dopant composition can be put in contact with each other by adding and suspending the nanomaterial in a solution in which the dopant composition is dissolved in the solvent. For sufficiently putting the dopant composition and the nanomaterial in contact with each other, preferably, the nanomaterial and the dopant are put in contact with each other by impregnating the nanomaterial with the solution in which the dopant composition is dissolved in the solvent or by shear dispersion of the nanomaterial in the solution in which the dopant composition is dissolved in the solvent.

Further, it is preferable that the nanomaterial and the dopant composition be put in contact with each other while the nanomaterial is being dispersed in the solution by use of a homogenization apparatus. Such dispersion of the nanomaterial in the solution by use of the homogenization apparatus allows the dopant composition to easily come in contact with the nanomaterial. This consequently allows the dopant composition and the nanomaterial to come in sufficient contact with each other.

The homogenization apparatus is not particularly limited as long as the homogenization apparatus can homogeneously disperse the nanomaterial in the solution. The homogenization apparatus can be known means such as a homogenizer or an ultrasonic homogenizer. Note that in the present specification, the simple wording "homogenizer" means a "stirring homogenizer".

In regard to an operating condition of the homogenization apparatus, the operating condition is not particularly limited as long as the homogenization apparatus can disperse the nanomaterial in the solvent under the operating condition. For example, in a case where the homogenization apparatus is a homogenizer, the nanomaterial can be dispersed, in a solution in which the nanomaterial and the dopant composition are added, by stirring the solution for forming a suspension at room temperature 23° C. for 10 minutes at a stirring speed (number of revolutions) of 20000 rpm of the homogenizer.

The solvent in which the dopant composition is to be dissolved can be, for example, water or an organic solvent. Accordingly, the manufacture method of the present invention is applicable to various nanomaterials. The organic solvent can be a highly polar solvent such as alcohol (e.g., methanol, ethanol, or, isopropyl alcohol), ketone (e.g., acetone, methyl ethyl ketone, or methyl isobutyl ketone), dimethyl sulfoxide, or, dimethyl formamide. The present invention is not limited to the above solvents.

The dopant composition can be dissolved at any concentration in the solvent. For example, respective concentrations of sodium hydroxide and 15-crown-5 in methanol can be each not less than 0.001 mol/L.

The dopant in the manufacture method of the present invention is an anion. As compared to conventional dopants, anions are more easily available and less expensive. Moreover, the solvent in the manufacture method of the present invention can be either an aqueous solvent or an organic solvent. The manufacture method of the present invention is applicable to various nanomaterials by use of aqueous solvents and organic solvents. Further, the manufacture method of the present invention does not require a complex step such as heating. This makes it possible to simply and efficiently manufacture the dopant composition-nanomaterial composite. Accordingly, the manufacture method of the present invention can simply and efficiently change a Seebeck coefficient of a nanomaterial.

<Molding Step>

The manufacture method of the present invention can include the step of molding the nanomaterial or the dopant composition-nanomaterial composite into a desired form. For example, in a molding step, the nanomaterial or the dopant composition-nanomaterial composite can be molded into a film form.

The term "film form" here can be reworded as "sheet form" or "layer form". The wording "molding into a film form" means molding the nanomaterial or the dopant composition-nanomaterial composite into a film of 1 μm to 1000 μm in thickness.

A method for molding the nanomaterial or the dopant composition-nanomaterial composite into a film form is not particularly limited, and can be, for example, a method employing a membrane filter. More specifically, the nanomaterial or the dopant composition-nanomaterial composite can be molded into a film form by subjecting a suspension of the nanomaterial or the dopant composition-nanomaterial composite to suction filtration by use of a membrane filter having a pore size of 0.1 μm to 2 μm and then drying a resultant film in vacuum at a temperature in a range of 50° C. to 150° C. for 1 hour to 24 hours.

In the manufacture method of the present invention, the nanomaterial can be molded prior to the contact step or the dopant composition-nanomaterial composite can be molded after the contact step. In a case where the molding step is carried out after the contact step, the dopant composition can be sufficiently adsorbed to each nanomaterial dispersed in the solvent. This makes it possible to obtain a film-form material in which nanomaterials are more uniformly doped. If, for example, the film-form material contains both doped nanomaterials having n-type conductivity and undoped nanomaterials having p-type conductivity, a Seebeck effect may be cancelled. However, in a case where the molding step is carried out after the contact step, there is no concern about cancellation of a Seebeck effect because a film-form material in which nanomaterials are more uniformly doped is obtained as described above.

[Dopant Composition-Nanomaterial Composite]

The dopant composition-nanomaterial composite in accordance with the present invention (hereinafter, also referred to as "dopant composition-nanomaterial composite of the present invention") contains the nanomaterial and the dopant composition which are described above, and is characterized in that the dopant composition-nanomaterial composite is manufactured by the manufacture method of the present invention. In other words, the dopant composition-nanomaterial composite of the present invention contains a nanomaterial and a dopant composition for changing a Seebeck coefficient of the nanomaterial, and the dopant composition contains an anion, a cation, and a scavenger for capturing the cation. Note that descriptions on the matters described in the preceding section [Method for Manufacturing Dopant Composition-Nanomaterial Composite] will be omitted here.

The dopant composition-nanomaterial composite of the present invention preferably exhibits n-type conductivity. When the dopant composition-nanomaterial composite has n-type conductivity, this dopant composition-nanomaterial composite can be used as an n-type material in a bipolar element.

The dopant composition-nanomaterial composite of the present invention can contain a substance in addition to the nanomaterial and the dopant composition. Such a substance is not limited in kind.

The present invention is not limited to the embodiments, but can be altered by a skilled person in the art within the scope of the claims. An embodiment derived from a proper combination of technical means each disclosed in a different embodiment is also encompassed in the technical scope of the present invention.

The present invention can be also arranged as follows.

A method in accordance with the present invention for manufacturing a dopant composition-nanomaterial composite is a method comprising the step of putting a dopant composition in contact with a nanomaterial in a solvent, the dopant composition being a composition for changing a Seebeck coefficient of a nanomaterial, and containing an anion, a cation, and a scavenger for capturing the cation.

In the above arrangement, in the dopant composition, the scavenger captures the cation which is a counter ion of the anion, so that the anion and the cation are dissociated from each other. As a result, the nanomaterial can be efficiently doped with the anion. The anion changes a nanomaterial carrier from a hole to an electron. Accordingly, the dopant composition changes a Seebeck coefficient of the nanomaterial.

The anion is contained in various compounds and easily available. Moreover, the anion is one form of an ion, and accordingly, can be used in both an aqueous solvent and an organic solvent. Further, the above arrangement does not require an operation such as heating. In addition, the dopant composition is capable of doping various nanomaterials.

Therefore, the above arrangement makes it possible to simply and efficiently change a Seebeck coefficient value of a nanomaterial.

The method in accordance with the present invention for manufacturing a dopant composition-nanomaterial can be arranged such that the anion is at least one selected from the group consisting of $OH^-$, $CH_3O^-$, $CH_3CH_2O^-$, $i\text{-}PrO^-$, $t\text{-}BuO^-$, $SH^-$, $CH_3S^-$, $C_2H_5S^-$, $CN^-$, $I^-$, $Br^-$, $Cl^-$ and $CH_3COO^-$.

The method in accordance with the present invention for manufacturing a dopant composition-nanomaterial composite can be arranged such that: the cation is a metal ion; and the scavenger is an organic ligand.

The method in accordance with the present invention for manufacturing a dopant composition-nanomaterial can be arranged such that the nanomaterial is at least one selected from the group consisting of nanoparticles, nanotubes, nanowires, nanorods and nanosheets.

The method in accordance with the present invention for manufacturing a dopant composition-nanomaterial can be arranged such that in the step of putting the dopant composition in contact with the nanomaterial, the nanomaterial and the dopant composition are put in contact with each other by impregnating the nanomaterial with a solution in which the dopant composition is dissolved in the solvent or by shear dispersion of the nanomaterial in the solution in which the dopant composition is dissolved in the solvent.

The method in accordance with the present invention for manufacturing a dopant composition-nanomaterial can be arranged such that the anion is an n-type dopant.

A dopant composition-nanomaterial composite in accordance with the present invention is manufactured by the method in accordance with the present invention for manufacturing a dopant composition-nanomaterial.

A dopant composition in accordance with the present invention is a dopant composition for changing a Seebeck coefficient of a nanomaterial, the dopant composition containing an anion, a cation, and a scavenger for capturing the cation.

The dopant composition-nanomaterial composite in accordance with the present invention can be arranged such that the anion is at least one selected from the group consisting of $OH^-$, $CH_3O^-$, $CH_3CH_2O^-$, $i\text{-}PrO^-$, $t\text{-}BuO^-$, $SH^-$, $CH_3S^-$, $C_2H_5S^-$, $CN^-$, $I^-$, $Br^-$, $Cl^-$, and $CH_3COO^-$.

A dopant composition in accordance with the present invention can be arranged such that: the cation is a metal ion; and the scavenger is an organic ligand.

The dopant composition in accordance with the present invention can be arranged such that the anion is an n-type dopant.

A dopant composition-nanomaterial composite in accordance with the present invention can include a nanomaterial and the dopant composition in accordance with the present invention.

It has not been known so far that a Seebeck coefficient of a nanomaterial can be changed by using ions. The inventors of the present invention have first found such a fact. Note here that though benzylviologen described in Non-Patent Literature 6 is an ionic substance, Non-Patent Literature 6 discloses a technique characterized by using benzylviologen which has been reduced (that is, benzylviologen which is not in the form of an ion).

EXAMPLES

Figure 2:
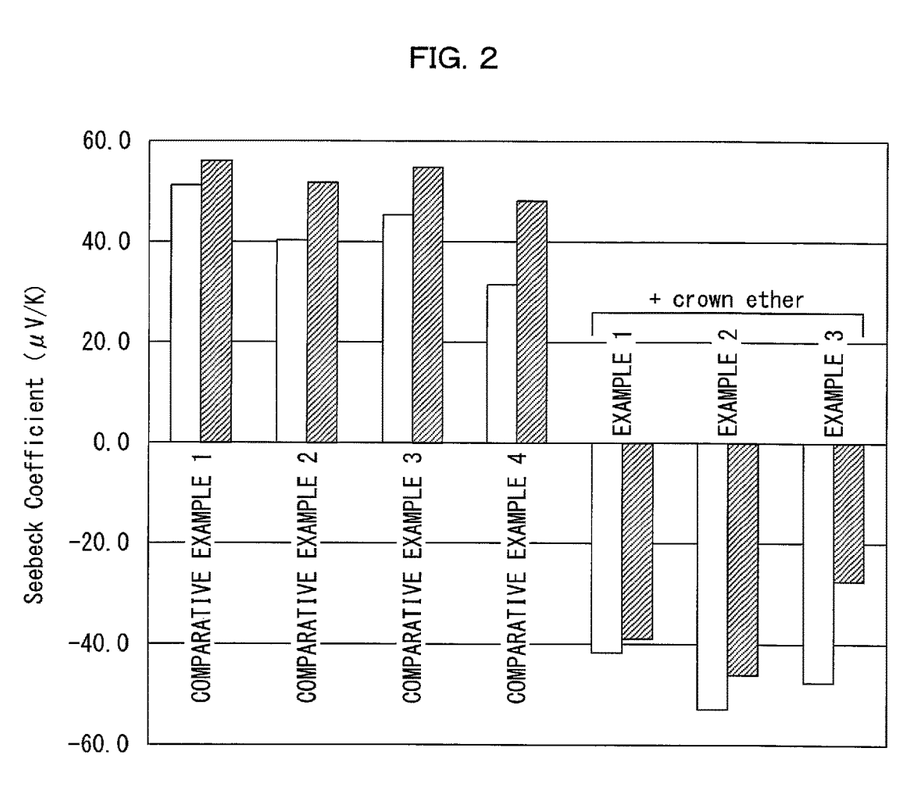
FIG. 2 is a chart illustrating respective Seebeck coefficients of carbon nanotube (CNT) films that are obtained in Examples 1 through 3 and Comparative Examples 1 through 4.
Figure 3:
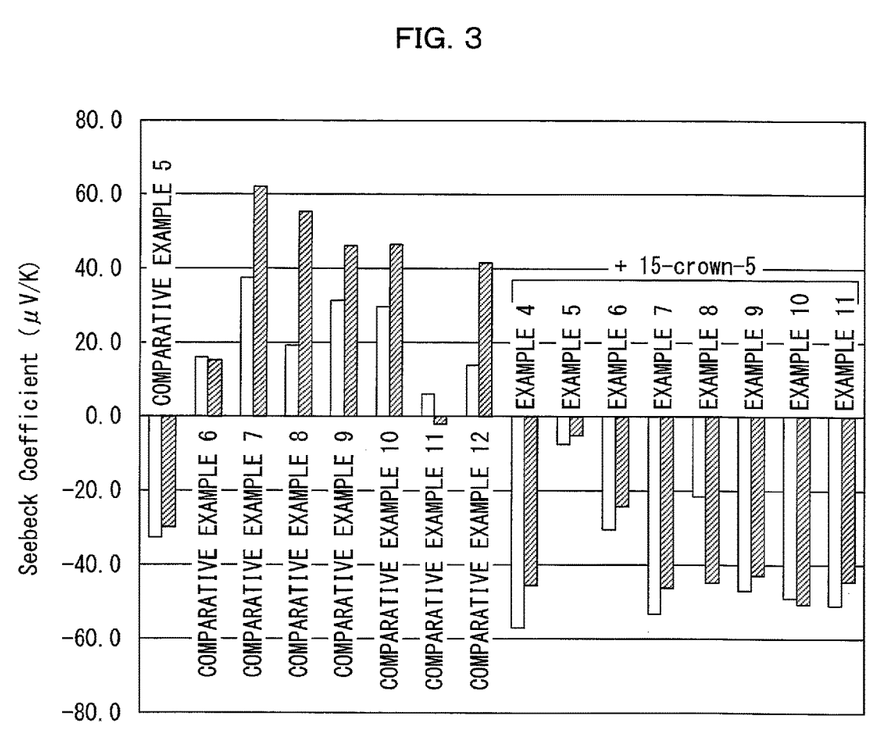
FIG. 3 is a chart illustrating respective Seebeck coefficients of carbon nanotube (CNT) films that are obtained in Examples 4 through 11 and Comparative Examples 5 through 12.

The following discusses Examples of the present invention with reference to FIGS. 2 and 3.

[Doping with Hydroxy Ion]

An effect of doping with a hydroxy ion was confirmed by use of a compound that produces a hydroxy ion as an anion when the compound is dissociated.

Example 1

As a compound that produces a hydroxy ion, KOH was used. Into 20 mL of methanol in which 0.1 M of KOH and 0.1 M of 18-crown-6 were dissolved, 5 mg of a bundle of carbon nanotubes were added. A resultant mixture was subjected to shear dispersion at 20000 rpm for 10 minutes by use of a high-speed homogenizer (manufactured by Ultra-Turrax).

A resultant dispersion liquid of carbon nanotubes was subjected to suction filtration by use of a Teflon (registered trademark) membrane filter having a pore size of 0.2 μm. Further, after the membrane filter was dried under reduced pressure for 12 hours, a carbon-nanotube film was peeled off from the membrane filter.

Then, a Seebeck coefficient of the carbon-nanotube film obtained as above was measured by use of a Seebeck effect measurement device SB-200 (Manufactured by MMR Technologies, Inc.). The carbon-nanotube film was evaluated at 310 K (a temperature displayed by the Seebeck effect measurement device). Note that carbon-nanotube films for measurement were prepared for both a case where the carbon nanotubes were made of a single walled carbon nanotube (hereinafter, also referred to as SGCNT) manufactured by National Institute of Advanced Industrial Science and Technology and a case where the carbon nanotubes were made of a single walled carbon nanotube (hereinafter, also referred to as KHCNT) manufactured by KH Chemicals. Hereinafter, the resultant carbon-nanotube film is also referred to as a CNT film.

Example 2

CNT films were prepared as in Example 1 except that NaOH was used in place of KOH and 15-crown-5 was used in place of 18-crown-6. Then, respective Seebeck coefficients of the CNT films were measured.

Example 3

CNT films were prepared as in Example 1 except that LiOH was used in place of KOH and 12-crown-4 was used in place of 18-crown-6. Then, respective Seebeck coefficients of the CNT films were measured.

Comparative Example 1

CNT films were prepared as in Example 1 except that neither KOH nor 18-crown-6 was added. Then, respective Seebeck coefficients of the CNT films were measured.

Comparative Example 2

CNT films were prepared as in Example 1 except that 18-crown-6 was not added and only KOH was used. Then, respective Seebeck coefficients of the CNT films were measured.

Comparative Example 3

CNT films were prepared as in Example 2 except that 15-crown-5 was not added and only NaOH was used. Then, respective Seebeck coefficients of the CNT films were measured.

Comparative Example 4

A CNT film was prepared as in Example 3 except that 12-crown-4 was not added and only LiOH was used. Then, respective Seebeck coefficients of the CNT films were measured.

<Experimental Results>

FIG. 2 shows results of Examples 1 through 3 and Comparative Examples 1 through 4. As described above, a polarity of each carbon nanotube can be determined depending on whether the Seebeck coefficient is positive or negative. It is clear from Comparative Example 1 that undoped CNT films exhibit p-type conductivity. Further, in Comparative Examples 2 through 4 in which crown ether was not added, the CNT films exhibited p-type conductivity as in Comparative Example 1. On the other hand, in a case where crown ether was used, the CNT films exhibited n-type conductivity as shown in Examples 1 through 3.

In other words, it was confirmed that in Examples 1 through 3, more hydroxy ions which were counter ions of metal ions were dissociated and acted as an n-type dopant because the metal ions had been captured by crown ether.

It was confirmed from the above results that unlike a Seebeck coefficient value of an untreated CNT film which has not been doped, a Seebeck coefficient value of a CNT film manufactured by the manufacture method of the present invention can be changed. It was also confirmed that hydroxy ions are usable as a dopant. Further, when crown ether was used in the manufacture method of the present invention, a Seebeck coefficient value of a CNT film can be more largely changed. This confirmed that use of crown ether in the manufacture method of the present invention can change the Seebeck coefficient value from a positive value to a negative value.

In addition, an advantageous effect of the manufacture method of the present invention was confirmed in both of the cases of SGCNT and KHCNT, in Examples 1 through 3. In other words, it was clarified that the advantageous effect brought about by the manufacture method of the present invention does not depend on types of carbon nanotubes.

[Doping with Anion which is not Hydroxy Ion]

By use of a sodium salt that produces an anion which is not a hydroxy ion, an effect of doping was confirmed.

Example 4

CNT films were prepared as in Example 2 except that NaSH was used in place of NaOH. Then, respective Seebeck coefficients of the CNT films were measured.

Example 5

CNT films were prepared as in Example 2 except that NaI was used in place of NaOH. Then, respective Seebeck coefficients of the CNT films were measured.

Example 6

CNT films were prepared as in Example 2 except that NaBr was used in place of NaOH. Then, respective Seebeck coefficients of the CNT films were measured.

Example 7

CNT films were prepared as in Example 2 except that NaCl was used in place of NaOH. Then, respective Seebeck coefficients of the CNT films were measured.

Example 8

CNT films were prepared as in Example 2 except that NaOMe (sodium methoxide) was used in place of NaOH. Then, respective Seebeck coefficients of the CNT films were measured.

Example 9

CNT films were prepared as in Example 2 except that NaOEt (sodium ethoxide) was used in place of NaOH. Then, respective Seebeck coefficients of the CNT films were measured.

Example 10

CNT films were prepared as in Example 2 except that NaOBu (sodium butoxide) was used in place of NaOH. Then, respective Seebeck coefficients of the CNT films were measured.

Example 11

CNT films were prepared as in Example 2 except that $CH_3COONa$ was used in place of NaOH. Then, respective Seebeck coefficients of the CNT films were measured.

Comparative Example 5

CNT films were prepared as in Example 4 except that 15-crown-5 was not added and only NaSH was used. Then, respective Seebeck coefficients of the CNT films were measured.

Comparative Example 6

CNT films were prepared as in Example 5 except that 15-crown-5 was not added and only NaI was used. Then, respective Seebeck coefficients of the CNT films were measured.

Comparative Example 7

CNT films were prepared as in Example 6 except that 15-crown-5 was not added and only NaBr was used. Then, respective Seebeck coefficients of the CNT films were measured.

Comparative Example 8

CNT films were prepared as in Example 7 except that 15-crown-5 was not added and only NaCl was used. Then, respective Seebeck coefficients of the CNT films were measured.

Comparative Example 9

CNT films were prepared as in Example 8 except that 15-crown-5 was not added and only NaOMe was used. Then, respective Seebeck coefficients of the CNT films were measured.

Comparative Example 10

CNT films were prepared as in Example 9 except that 15-crown-5 was not added and only NaOEt was used. Then, respective Seebeck coefficients of the CNT films were measured.

Comparative Example 11

CNT films were prepared as in Example 10 except that 15-crown-5 was not added and only NaOBu was used. Then, respective Seebeck coefficients of the CNT films were measured.

Comparative Example 12

CNT films were prepared as in Example 11 except that 15-crown-5 was not added and only $CH_3COONa$ was used. Then, respective Seebeck coefficients of the CNT films were measured.

<Experimental Results>

FIG. 3 shows results of Examples 4 through 11 and Comparative Examples 5 through 12. The CNT films of Comparative Examples 6 through 12, like the CNT films of Comparative Example 1, exhibited p-type conductivity. On the other hand, in a case where crown ether was used, the CNT films exhibited n-type conductivity as shown in Examples 4 through 11.

Further, it is clear from Comparative Example 5 that in a case where NaSH was used, the CNT films exhibited n-type conductivity even without use of crown ether. However, in Example 4 where both NaSH and crown ether were used, the Seebeck coefficient was even lower.

In comparison of Example 4 and the above Examples 1 through 3, $SH^-$ has a greater Seebeck-coefficient changing effect than $OH^-$. Further, in comparison of Examples 5 through 7, levels of Seebeck-coefficient changing effects of $I^-$, $Br^-$, and $Cl^-$ are $I^-<Br^-<Cl^-$. This result suggests the importance of Lewis basicity.

In comparison of Examples 8 through 10, levels of Seebeck-coefficient changing effects of $^-OMe$, $^-OEt$, and $^-OBu$ are $^-OMe<^-OEt<^-OBu$. This result suggests the importance of weak hydrogen bonding, for example, a $CH$-$\pi$ interaction in addition to basicity. Furthermore, use of $CH_3COO^-$ also provides a great effect. This result suggests the importance of adsorption caused by a $CH$-$\pi$ interaction and a $\pi$-$\pi$ interaction.

It was confirmed from these results that unlike a Seebeck coefficient value of an untreated CNT film which has not been doped, a Seebeck coefficient value of a CNT film manufactured by the manufacture method of the present invention can be changed even in a case where an anion which is not a hydroxy ion is used as the anion. Further, it was confirmed that in a case where crown ether is used in the manufacture method of the present invention, a Seebeck coefficient value of a CNT film can be more largely changed and consequently, the Seebeck coefficient value can be changed from a positive value to a negative value. These results make it possible to consider that practically, an indefinite number of anions are applicable.

INDUSTRIAL APPLICABILITY

Doped nanomaterials can be tools for construction of various devices such as field-effect transistors, thermoelectric conversion elements, and photovoltaic cells. Accordingly, the present invention can be applied to various industries in a wide range of fields in which nanomaterials are used.

The invention claimed is:

1. A method for manufacturing a dopant composition-nanomaterial composite, the method comprising:
    putting a dopant composition in contact with a nanomaterial in a solvent,
    wherein the dopant composition is a composition for changing a Seebeck coefficient of a nanomaterial, and contains an anion, a cation, and a scavenger for capturing the cation, and
    wherein the scavenger is cyclodextrin, crown ether, azacrown ether, ethylenediaminetetraacetate, calixarene, salen, or a derivative thereof.

2. The method as set forth in claim 1, wherein the anion is at least one selected from the group consisting of $OH^-$, $CH_3O^-$, $CH_3CH_2O^-$, i-$PrO^-$, t-$BuO^-$, $SH^-$, $CH_3S^-$, $C_2H_5S^-$, $CN^-$, $I^-$, $Br^-$, $Cl^-$ and $CH_3COO^-$.

3. The method as set forth in claim 1, wherein:
    the cation is a metal ion; and
    the scavenger is an organic ligand.

4. The method as set forth in claim 1, wherein the nanomaterial is at least one selected from the group consisting of nanoparticles, nanotubes, nanowires, nanorods and nanosheets.

5. The method as set forth in claim 1, wherein the nanomaterial and the dopant composition are put in contact with each other by impregnating the nanomaterial with a solution in which the dopant composition is dissolved in the solvent or by shear dispersion of the nanomaterial in the solution in which the dopant composition is dissolved in the solvent.

6. The method as set forth in claim 1, wherein the anion is an n-type dopant.

7. A dopant composition-nanomaterial composite, comprising:
  a nanomaterial; and
  a dopant composition,
  wherein the dopant composition is a composition for changing a Seebeck coefficient of a nanomaterial, and contains an anion, a cation, and a scavenger for capturing the cation,
  wherein the scavenger is cyclodextrin, crown ether, azac-rown ether, ethylenediaminetetraacetate, calixarene, salen, or a derivative of any thereof, and
  wherein the dopant composition-nanomaterial composite comprises the anion and the scavenger having the cation captured therein.

8. The composite as set forth in claim 7, wherein the anion is at least one selected from the group consisting of $OH^-$, $CH_3O^-$, $CH_3CH_2O^-$, $i\text{-}PrO^-$, $t\text{-}BuO^-$, $SH^-$, $CH_3S^-$, $C_2H_5S^-$, $CN^-$, $I^-$, $Br^-$, $Cl^-$ and $CH_3COO^-$.

9. The composite of claim 7, wherein: the cation is a metal ion; and the scavenger is an organic ligand.

10. The composite of claim 7, wherein the nanomaterial is at least one selected from the group consisting of nanoparticles, nanotubes, nanowires, nanorods and nanosheets.

11. The composite of claim 7, wherein the anion is an n-type dopant.

* * * * *